(12) United States Patent
Wang et al.

(10) Patent No.: US 6,641,448 B2
(45) Date of Patent: Nov. 4, 2003

(54) MANUFACTURING METHOD FOR WHITE LIGHT SOURCE

(75) Inventors: Chien-Yuan Wang, Kaohsiung Hsien (TW); Ru-Shi Liu, Hsinchu Hsien (TW); Hung-Yuan Su, Taipei Hsien (TW); Chen-Lun Hsing Chen, Taipei Hsien (TW)

(73) Assignee: Lite-On Technology Corporation, Taipei (TW)

( * ) Notice: Subject to any disclaimer, the term of this patent is extended or adjusted under 35 U.S.C. 154(b) by 14 days.

(21) Appl. No.: 09/986,846

(22) Filed: Nov. 13, 2001

(65) Prior Publication Data

US 2003/0092345 A1 May 15, 2003

(51) Int. Cl.[7] .............................. H01J 9/00; H01J 9/24
(52) U.S. Cl. ........................................... 445/23; 445/24
(58) Field of Search .......................... 445/23, 24, 25; 313/485, 486, 487; 252/301.4 R, 301.6 P, 301.4 P; 257/88, 89, 79

(56) References Cited

U.S. PATENT DOCUMENTS

| 3,707,641 | A | * | 12/1972 | Thornton | .................... | 313/487 |
|---|---|---|---|---|---|---|
| 4,075,532 | A | * | 2/1978 | Piper et al. | ................. | 313/487 |
| 4,176,294 | A | * | 11/1979 | Thornton, Jr. | .............. | 313/487 |
| 4,176,299 | A | * | 11/1979 | Thornton, Jr. | .............. | 313/487 |
| 4,458,176 | A | * | 7/1984 | Chenot et al. | .............. | 313/487 |
| 6,069,440 | A | * | 5/2000 | Shimizu et al. | ............. | 313/486 |
| 6,153,971 | A | * | 11/2000 | Shimizu et al. | ............. | 313/486 |
| 6,245,259 | B1 | * | 6/2001 | Hohn et al. | .................... | 257/89 |
| 6,252,254 | B1 | * | 6/2001 | Soules et al. | ................. | 257/89 |
| 6,255,670 | B1 | * | 7/2001 | Srivastava et al. | ............ | 257/89 |
| 6,294,800 | B1 | * | 9/2001 | Duggal et al. | ................. | 257/89 |
| 6,337,536 | B1 | * | 1/2002 | Matsubara et al. | ......... | 313/498 |
| 6,392,337 | B1 | * | 5/2002 | Yoon et al. | .................... | 313/478 |
| 6,429,583 | B1 | * | 8/2002 | Levinson et al. | ........... | 313/503 |
| 6,445,119 | B1 | * | 9/2002 | Mori et al. | .................... | 313/486 |
| 6,466,135 | B1 | * | 10/2002 | Srivastava et al. | .......... | 313/486 |
| 6,501,100 | B1 | * | 12/2002 | Srivastava et al. | ............ | 257/79 |
| 6,501,102 | B2 | * | 12/2002 | Mueller-Mach et al. | ...... | 257/84 |
| 6,504,179 | B1 | * | 1/2003 | Ellens et al. | .................. | 257/88 |
| 6,509,685 | B1 | * | 1/2003 | Justel et al. | ................. | 313/486 |
| 6,522,065 | B1 | * | 2/2003 | Srivastava et al. | .......... | 313/503 |

* cited by examiner

Primary Examiner—Anthony Dinkins
Assistant Examiner—Angel R. Estrada
(74) Attorney, Agent, or Firm—Rosenberg, Klein & Lee

(57) ABSTRACT

A manufacturing method for white light source utilizes an ultraviolet light source and suitable phosphors. One of the phosphors is directly excited by the ultraviolet light source and generates a radiation with longer wavelength. Other phosphors are excited by the radiation with longer wavelength and generate radiation with much longer wavelength. The lights generated by those phosphors are mixed to form a white light.

10 Claims, 5 Drawing Sheets

MANUFACTURING METHOD FOR WHITE LIGHT SOURCE

FIELD OF THE INVENTION

The present invention relates to a manufacturing method for white light source, especially to a manufacturing method for high-brightness white light source by an ultraviolet light source and suitable phosphors directly or indirectly excited by the ultraviolet light source.

BACKGROUND OF THE INVENTION

A white light source is generally provided by mixing light source of different wavelength and the white light sensed by human vision is generally composed of light of at least two colors. For example, a conventional white light source can be realized by mixing red light, green light and blue light with suitable intensity ratio. Alternatively, the white light source can be realized by mixing yellow light and blue light with suitable intensity ratio.

The conventional white light source generally uses at least phosphors of different color to ensure color-rendering property. However, one of the prerequisites to provide high-efficiency white light source is that light from the exciting light source can be absorbed by all the phosphors. Moreover, all the phosphors have compatible absorption coefficients with respect to the light from the exciting light source. Furthermore, the quantum efficiencies of the phosphors should be compatible to facilitate light mixing.

As can be seen above description, the phosphors should be prudently chosen to have absorption band matched with the wavelength of the exciting radiation. Moreover, the phosphors should have compatible absorption coefficients and quantum efficiency to provide white light of high quality. Those requirements place a strict constrain to the materials of the phosphors.

SUMMARY OF THE INVENTION

It is the object of the present invention to provide a manufacturing method for high-brightness white light source by ultraviolet light source and suitable phosphors, wherein one phosphor is excited by the ultraviolet light source and other phosphors are excited by the light re-emitted from the phosphor excited by the ultraviolet light.

In one aspect of the present invention, the present invention provides a manufacturing method for white light source utilizing an ultraviolet light source and suitable phosphors. One of the phosphors is excited by the ultraviolet light source and generates a radiation with longer wavelength. Other phosphors are excited by the radiation with longer wavelength and generate radiation with much longer wavelength. The lights generated by those phosphors are mixed to form a white light.

In another aspect of the present invention, the present invention provides a manufacturing method for white light source utilizing an ultraviolet light source and suitable phosphors. The phosphors are directly and indirectly excited by the ultraviolet light source and the lights generated by those phosphors are mixed to form a white light. Therefore, the ultraviolet light source and the phosphors are packaged to form a white light source with low operation current.

The various objects and advantages of the present invention will be more readily understood from the following detailed description when read in conjunction with the appended drawing, in which:

DETAILED DESCRIPTION OF THE INVENTION

The present invention is intended to provide a manufacturing method for white light source utilizing an ultraviolet light source and suitable phosphors. One of the phosphors is excited by the ultraviolet light source and generates a radiation with longer wavelength. Other phosphors are excited by the radiation with longer wavelength and generate radiation with much longer wavelength. The lights generated by those phosphors are mixed to form a white light. In the preferred embodiment of the present invention, two phosphors are used.

The ultraviolet light source can be realized by ultraviolet LED, electron beam or plasma.

The phosphor emits blue light upon excited by ultraviolet light can be selected from a group consisting of $BaMgAl_{10}O_{17}:Eu$; $ZnS:Ag$; and $(Sr, Ca, Ba, Mg)_{10}(PO_4)_6Cl_2:Eu$.

The phosphor emits yellow light upon excited by blue light can be selected from a group consisting of $Y_3Al_5O_{12}:Ce, Gd$; $ZnS:Mn$; and $3Cd_3(PO_4)_2CdCl_2:Mn$.

Figure 1:
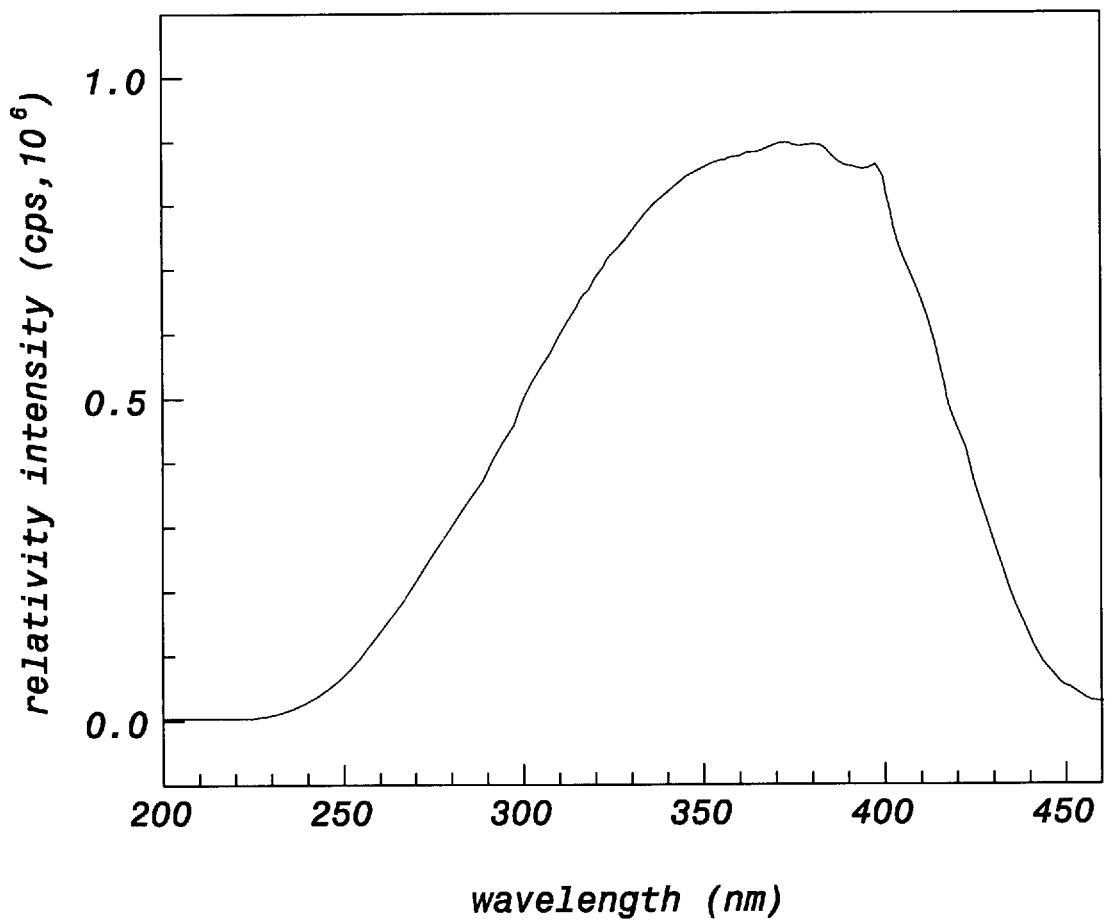
FIG. 1 shows the excitation spectrum of the $(Ba_{0.9}Eu_{0.1})MgAl_{10}O_{17}$ phosphor powder with reference to wavelength 488 nm.
Figure 2:
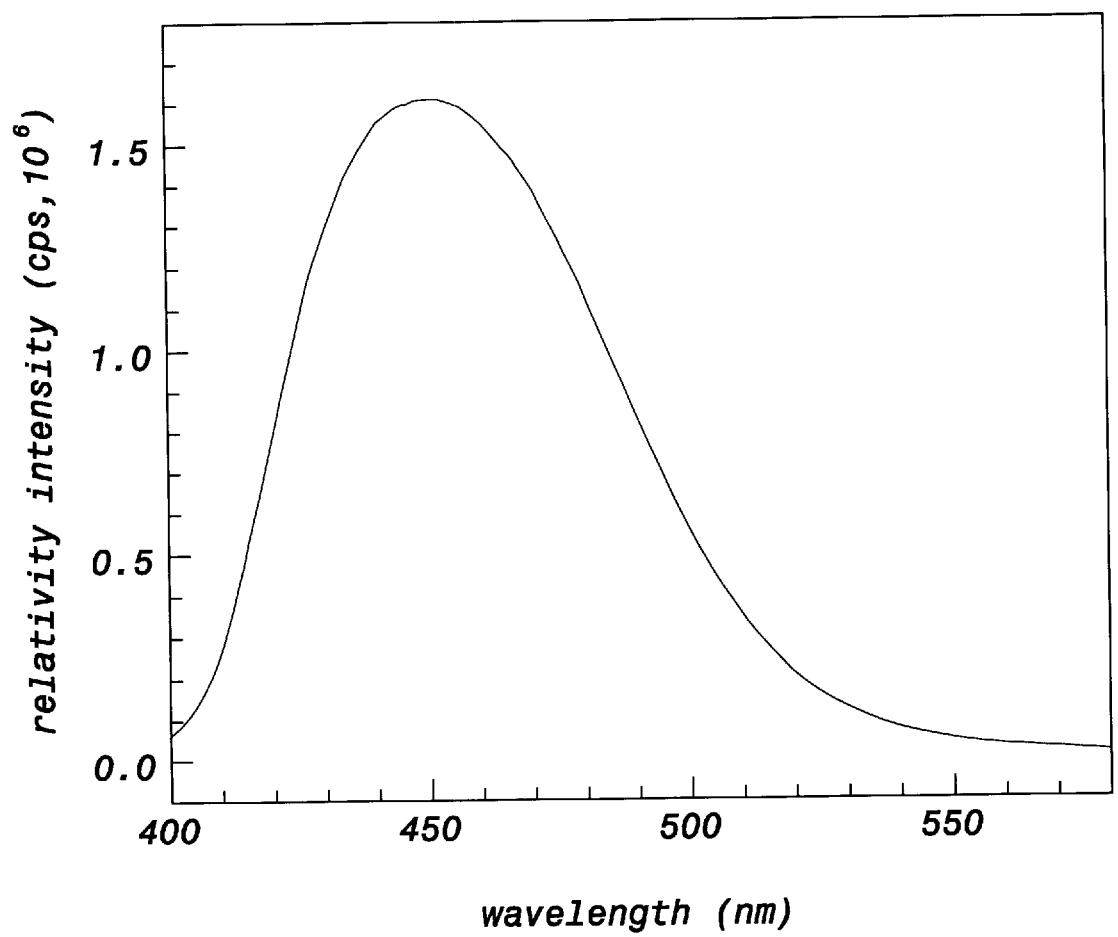
FIG. 2 shows the emission spectrum of the $(Ba_{0.9}Eu_{0.1})MgAl_{10}O_{17}$ phosphor powder excited by a 382 nm ultraviolet light.

The method for preparing the phosphors used in the present invention are described below:

1. Synthesizing a phosphor powder with formula $BaMgAl_{10}O_{17}:Eu$ (denoted by BAM) such as $(Ba_{0.9}Eu_{0.1})MgAl_{10}O_{17}$ by solid-state reaction or chemosynthesis method such as citrate sol gel or co-precipitation.
2. Synthesizing a phosphor powder with formula $Y_3Al_5O_{12}:Ce, Gd$ (denoted by YAG) such as $(Y_{2.3}Ce_{0.05}Gd_{0.65})Al_5O_{12}$ by solid-state reaction or chemosynthesis method such as citrate sol gel or co-precipitation.
3. Measuring the excitation spectrum of the $(Ba_{0.9}Eu_{0.1})MgAl_{10}O_{17}$ phosphor powder with reference to wavelength 488 nm. As shown in FIG. 1, the $(Ba_{0.9}Eu_{0.1})MgAl_{10}O_{17}$ phosphor powder can be excited by an ultraviolet light.
4. Measuring the emission spectrum of the $(Ba_{0.9}Eu_{0.1})MgAl_{10}O_{17}$ phosphor powder excited by a 382 nm ultraviolet light. As shown in FIG. 2, the $(Ba_{0.9}Eu_{0.1})MgAl_{10}O_{17}$ phosphor powder emits a blue light after being excited by a 382 nm ultraviolet light. The color coordinate of the blue light is determined with reference to 1931 CIE (commission internationale del'Eclairage) chromaticity diagram and is marked by letter "A" in FIG. 3.

Figure 4:
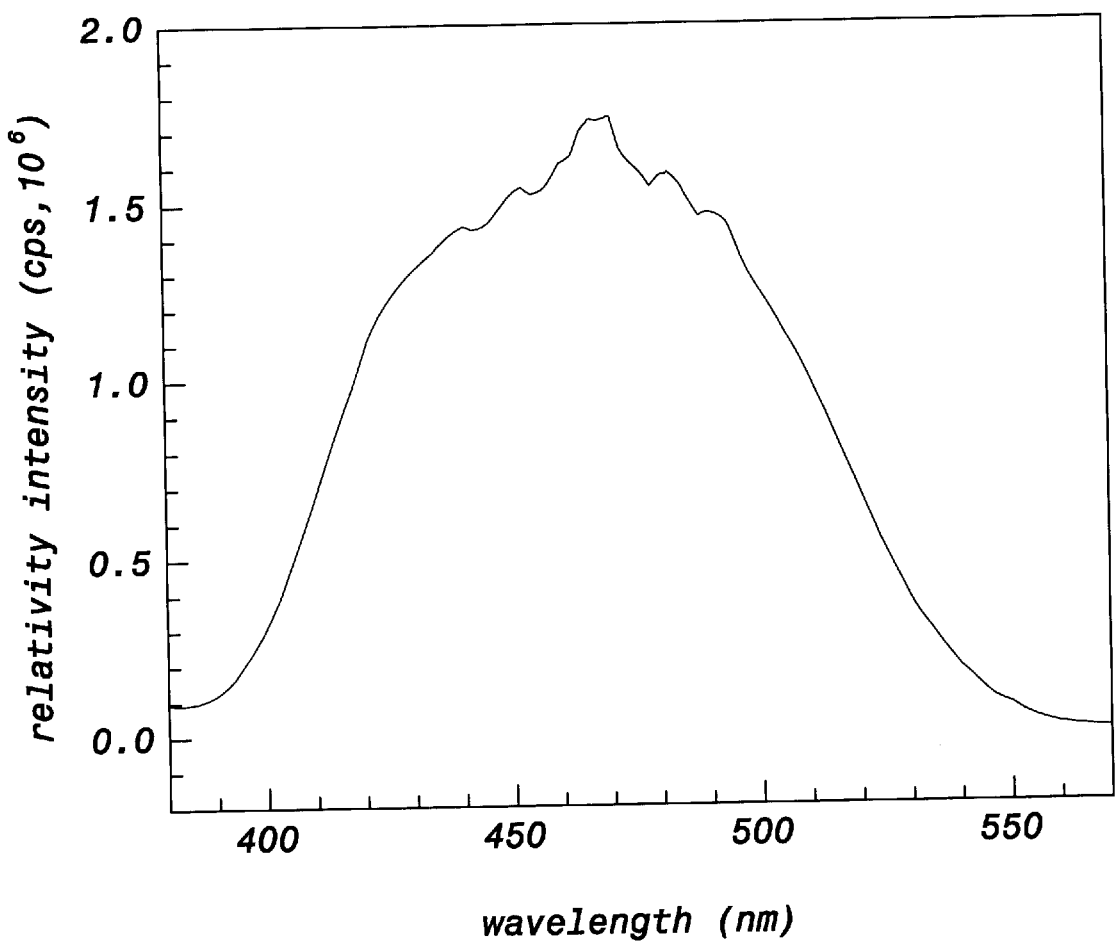
FIG. 4 shows the excitation spectrum of the $(Y_{2.3}Ce_{0.05}Gd_{0.65})Al_5O_{12}$ phosphor powder with reference to wavelength 600 nm.

5. Measuring the excitation spectrum of the $(Y_{2.3}Ce_{0.05}Gd_{0.65})Al_5O_{12}$ phosphor powder with reference to wavelength 600 nm. As shown in FIG. 4, the YAG phosphor powder can be excited by a blue light with wavelength 400–490 nm.

Figure 5:
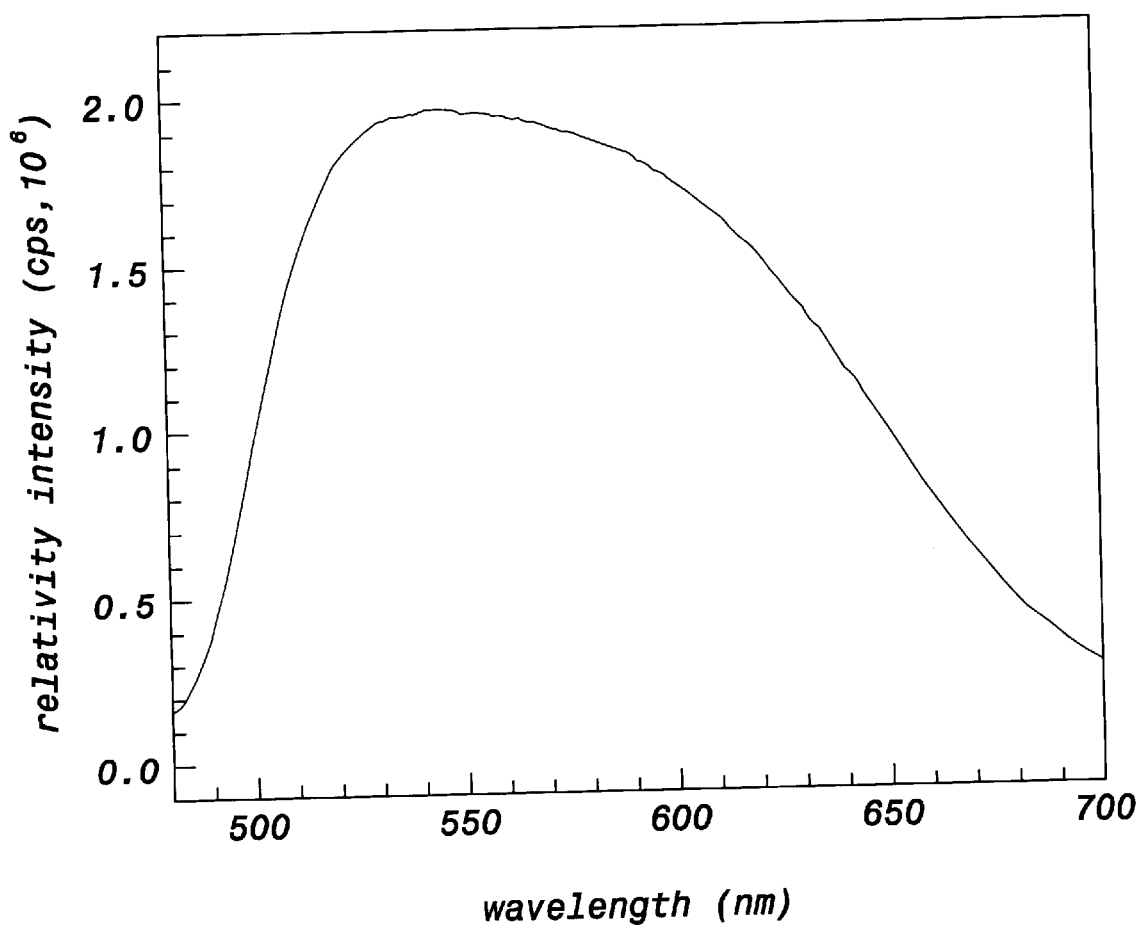
FIG. 5 shows the emission spectrum of the $((Y_{2.3}Ce_{0.05}Gd_{0.65})Al_5O_{12}$ phosphor powder excited by a 470 nm ultraviolet light.

6. Measuring the emission spectrum of the $(Y_{2.3}Ce_{0.05}Gd_{0.65})Al_5O_{12}$ phosphor powder excited by a 470 nm light. As shown in FIG. 5, the $(Y_{2.3}Ce_{0.05}Gd_{0.65})Al_5O_{12}$ phosphor powder emits a yellow light after being excited by a blue light. The color coordinate of the blue light is determined with reference to 1931 CIE chromaticity diagram and is marked by letter "B" in FIG. 3.

Figure 3:
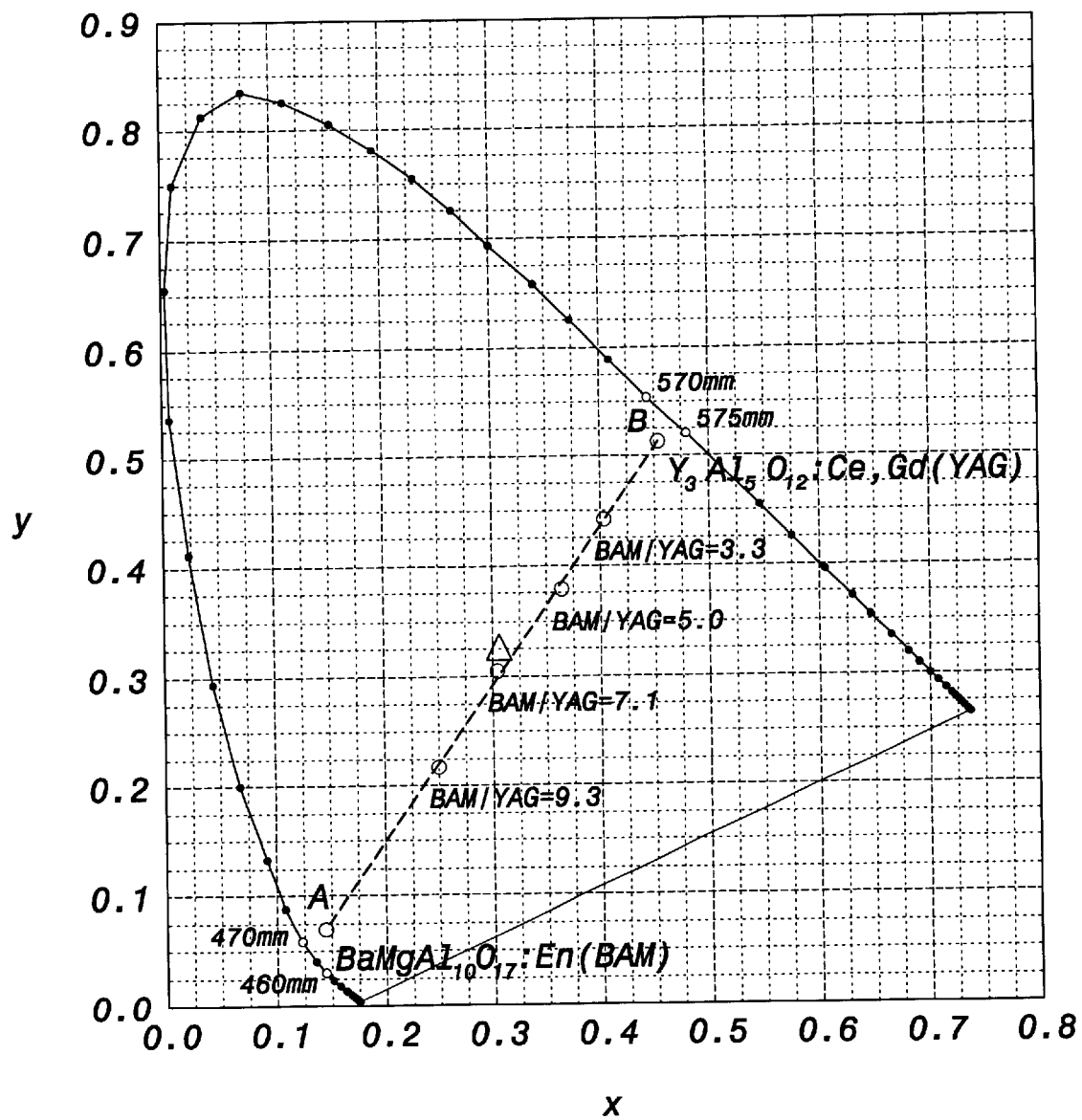
FIG. 3 shows the color temperature variations of different BAM/YAG ratios radiated by a 382 nm ultraviolet light in the CIE chromaticity diagram.

7. Mixing the above BAM phosphor powder and YAG phosphor powder in different ratios (BAM/YAG=3.3, 5.0, 7.1 and 9.3, respectively) and a 382 nm ultraviolet LED is used as exciting radiation. The color temperature variations for different BAM/YAG ratios are shown in FIG. 3.

8. Drawing a dashed straight line connecting points A and B in FIG. 3. As can be seen from FIG. 3, the dashed straight line passes a white light region in the CIE chromaticity diagram. Moreover, the color temperature variations for different BAM/YAG ratios are also located along the dashed straight line.

The above BAM phosphor powder and YAG phosphor powder can be mixed in different ratio and packaged with an ultraviolet light source as exciting radiation, thus forming a white light source such as a white light LED. The package of the white light LED can be implemented in one of the forms including lamp, SMD (surface mount device) and COB (chip on board).

To sum up, the white light source provided by the present invention has peculiar advantages over prior art white light source in following aspects:

1. The phosphor in the present invention can be excited by light emitted from another phosphor. Therefore, the phosphors used in the present invention are not constrained to be excited by same light source. The applicability of phosphors is enhanced.

2. The white light source can be formed by wide variety of phosphors; the color-rendering property and efficiency are enhanced.

Although the present invention has been described with reference to the preferred embodiment thereof, it will be understood that the invention is not limited to the details thereof. Various substitutions and modifications have suggested in the foregoing description, and other will occur to those of ordinary skill in the art. For example, the present invention can use phosphors directly or indirectly excited by an ultraviolet light source and mixed in suitable ratio to provide uniform and high-brightness white light source. Therefore, all such substitutions and modifications are intended to be embraced within the scope of the invention as defined in the appended claims.

We claim:

1. A method for manufacturing a white light source, the method comprising the steps of:
    (a) synthesizing a first phosphor powder and a second phosphor powder;
    (b) mixing the first phosphor powder and the second phosphor powder according to a mixing ratio into a phosphor mixture, the mixing ratio determined by the steps of:
        (1) measuring at a first reference wavelength an emission response of the first phosphor powder to a plurality of excitation wavelengths within a first band of excitation wavelengths;
        (2) selecting a first excitation wavelength from the first band of excitation wavelengths based upon the emission response measured in step (1);
        (3) measuring a spectral response of the first phosphor powder to the first excitation wavelength over a first band of emission wavelengths, the first band of emission wavelengths including a first emission wavelength;
        (4) indicating on a chromaticity chart a first color corresponding to the first emission wavelength;
        (5) measuring at a second reference wavelength an emission response of the second phosphor powder to a plurality of excitation wavelengths within a second band of excitation wavelengths;
        (6) selecting a second excitation wavelength from the second band of excitation wavelengths based upon the emission response measured in step (5);
        (7) measuring a spectral response of the second phosphor powder to the second excitation wavelength over a second band of emission wavelengths, the second band of emission wavelengths including a second emission wavelength;
        (8) indicating on a chromaticity chart a second color corresponding to the second emission wavelength;
        (9) drawing a line on the chromaticity chart from the indication of the first color to the indication of the second color; and
        (10) determining the mixing ratio of the first phosphor powder and the second phosphor powder such that an emitted color thereof lies on a line on the chromaticity chart in a region of white light;
    (c) providing a light source of the first excitation wavelength; and
    (d) applying the phosphor mixture to the light source.

2. The method of manufacturing a white light source as recited in claim 1, wherein the first excitation wavelength is ultraviolet.

3. The method of manufacturing a white light source as recited in claim 1, wherein the first emission wavelength of the first phosphor powder corresponds to the second excitation wavelength of the second phosphor powder.

4. The method of manufacturing a white light source as recited in claim 1, wherein the first reference wavelength corresponds to the first color and the second reference wavelength corresponds to the second color.

5. The method of manufacturing a white light source as recited in claim 1, wherein the mixing ratio determination of step (10) includes the steps of:
    (i) mixing the first phosphor powder and the second phosphor powder into a plurality of phosphor test mixtures according to a corresponding plurality of predetermined mixing ratios;
    (ii) indicating on the chromaticity chart a color temperature corresponding to light emitted by each of the phosphor test mixtures when excited by the first excitation wavelength; and
    (iii) interpolating between indications of color temperature corresponding to the light emitted by each of the phosphor test mixtures on each side of the region of white light to establish the mixing ratio of the first phosphor powder and the second phosphor powder.

6. The method for manufacturing a white light source as recited in claim 1, wherein the light source is one of an LED, an electronic beam and plasma.

7. The method for manufacturing a white light source as recited in claim 1, wherein the first color is blue and the second color is yellow.

8. The method for manufacturing a white light source as recited in claim 7, wherein the first phosphor powder is selected from a group consisting of $BaMgAl_{10}O_{17}$:Eu; ZnS:Ag; and $(Sr, Ca, Ba, Mg)_{10}(PO_4)_6Cl_2$:Eu; and the second phosphor powder is selected from a group consisting of $Y_3Al_5O_{12}$:Ce, Gd; ZnS:Mn; and $3Cd_3(PO_4)_2CdCl_2$:Mn.

9. The method for manufacturing a white light source as recited in claim 1, wherein the first phosphor powder and the second phosphor powder are made by one of a solid-state reaction and chemosynthesis method.

10. The method for manufacturing a white light source as recited in claim 1, wherein the light source applied with the phosphor mixture is packaged in one of the forms including lamp, surface mount device and chip on board.

* * * * *